United States Patent [19]
Fukunaga

[11] Patent Number: 5,617,437
[45] Date of Patent: Apr. 1, 1997

[54] SEMICONDUCTOR LASER

[75] Inventor: Toshiaki Fukunaga, Kanagawa-ken, Japan

[73] Assignee: Fuji Photo Film Co., Ltd., Kanagawa-ken, Japan

[21] Appl. No.: 561,465

[22] Filed: Nov. 21, 1995

[30] Foreign Application Priority Data

Nov. 24, 1994 [JP] Japan .................... 6-289774
Nov. 24, 1994 [JP] Japan .................... 6-289775

[51] Int. Cl.$^6$ ........................ H01S 3/19
[52] U.S. Cl. ................................ 372/45
[58] Field of Search ............................ 372/45

[56] References Cited

U.S. PATENT DOCUMENTS

| | | | |
|---|---|---|---|
| 5,436,924 | 7/1995 | Kamei et al. | 372/45 |
| 5,479,427 | 12/1995 | Yoshida et al. | 372/45 |
| 5,509,026 | 4/1996 | Sasaki et al. | 372/45 |

OTHER PUBLICATIONS

Journal of Quantum Electronics, vol. 27 No. 6 Jun. 1991.
IEEE Photonics Technology Letters, vol. 6 No. 1 Jan. 1994.
IEEE Journal of Quantum Electronics, vol. 30 No. 2 Feb. 1994.
IEEE Journal of Quantum Electronics, vol. QE–20, No. 10 Oct. 1984.
Jpn. J Appl. Phys. vol. 31 (1992) pp. L1686–L 1688 Part 2, No. 12A 1 Dec. 1992.
IEEE Photonics Technology Letters, vol. 6, No. 1 Jan. 1994.

Primary Examiner—James W. Davie
Attorney, Agent, or Firm—Sughrue, Mion, Zinn, Macpeak & Seas

[57] ABSTRACT

A semiconductor laser comprises an active layer, optical waveguide layers formed on opposite sides of the active layer, and cladding layers. The active layer is constituted of an InGaAsP type of compound semiconductor. Each of the optical waveguide layers is constituted of an InGaAsP type of quarternary compound semiconductor, in which the content of As in the Group-V elements is at least 2%, or an InGaAlAsP type of five-element compound semiconductor, in which the content of As in the Group-V elements falls within the range of 2% to 10%. Each of the cladding layers is constituted of an InGaAsP type of quarternary compound semiconductor, in which the content of As in the Group-V elements falls within the range of 2% to 10%, or an InGaAlAsP type of five-element compound semiconductor, in which the content of As in the Group-V elements falls within the range of 2% to 10%.

4 Claims, 6 Drawing Sheets

8: p-GaAs CONTACT LAYER
7: p-$In_{x3}(Ga_{1-z3}Al_{z3})_{1-x3}As_{1-y3}P_{y3}$ UPPER CLADDING LAYER
6: p- OR i-$In_{x2}(Ga_{1-z2}Al_{z2})_{1-x2}As_{1-y2}P_{y2}$ UPPER OPTICAL WAVEGUIDE LAYER
5: i-$In_{x1}Ga_{1-x1}As_{1-y1}P_{y1}$ QUANTUM WELL ACTIVE LAYER
4: n- OR i-$In_{x2}(Ga_{1-z2}Al_{z2})_{1-x2}As_{1-y2}P_{y2}$ LOWER OPTICAL WAVEGUIDE LAYER
3: n-$In_{x3}(Ga_{1-z3}Al_{z3})_{1-x3}As_{1-y3}P_{y3}$ LOWER CLADDING LAYER
2: n-GaAs SUBSTRATE

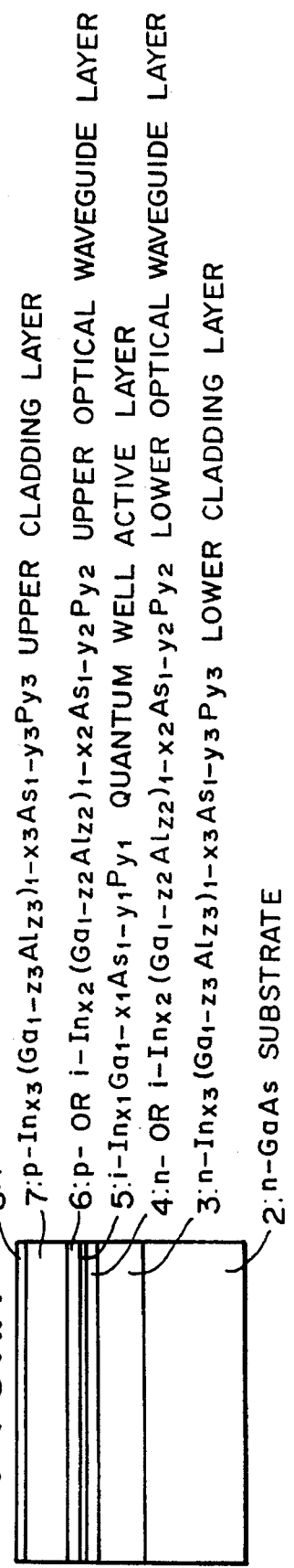
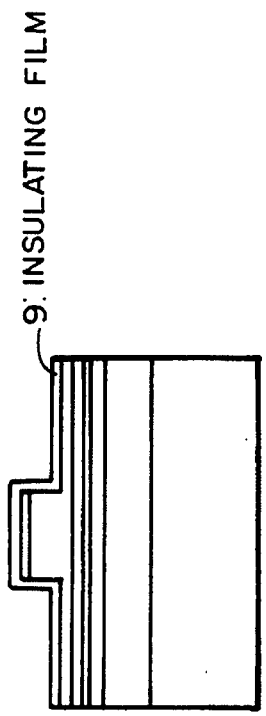
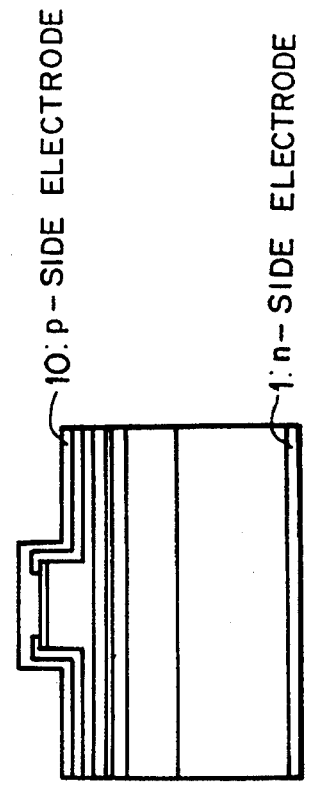
FIG. 1A
- 8: p-GaAs CONTACT LAYER
- 7: p-$In_{x3}(Ga_{1-z3}Al_{z3})_{1-x3}As_{1-y3}P_{y3}$ UPPER CLADDING LAYER
- 6: p- OR i-$In_{x2}(Ga_{1-z2}Al_{z2})_{1-x2}As_{1-y2}P_{y2}$ UPPER OPTICAL WAVEGUIDE LAYER
- 5: i-$In_{x1}Ga_{1-x1}As_{1-y1}P_{y1}$ QUANTUM WELL ACTIVE LAYER
- 4: n- OR i-$In_{x2}(Ga_{1-z2}Al_{z2})_{1-x2}As_{1-y2}P_{y2}$ LOWER OPTICAL WAVEGUIDE LAYER
- 3: n-$In_{x3}(Ga_{1-z3}Al_{z3})_{1-x3}As_{1-y3}P_{y3}$ LOWER CLADDING LAYER
- 2: n-GaAs SUBSTRATE
FIG. 1B
- 9: INSULATING FILM
FIG. 1C
- 10: p-SIDE ELECTRODE
- 1: n-SIDE ELECTRODE

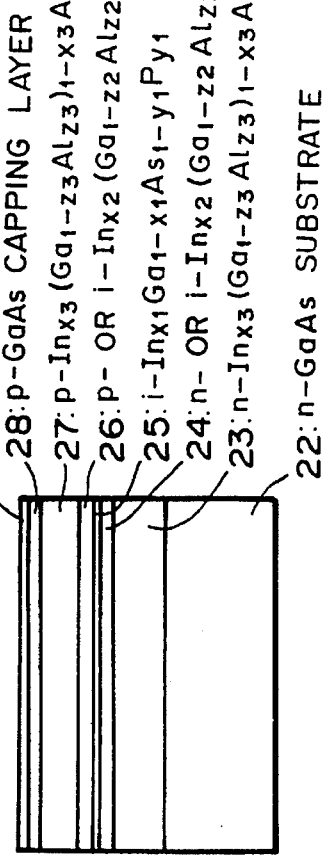

FIG. 3A

29: INSULATING FILM
28: p-GaAs CAPPING LAYER
27: p-$In_{x3}(Ga_{1-z3}Al_{z3})_{1-x3}As_{1-y3}P_{y3}$ UPPER CLADDING LAYER
26: p- OR i-$In_{x2}(Ga_{1-z2}Al_{z2})_{1-x2}As_{1-y2}P_{y2}$ UPPER OPTICAL WAVEGUIDE LAYER
25: i-$In_{x1}Ga_{1-x1}As_{1-y1}P_{y1}$ QUANTUM WELL ACTIVE LAYER
24: n- OR i-$In_{x2}(Ga_{1-z2}Al_{z2})_{1-x2}As_{1-y2}P_{y2}$ LOWER OPTICAL WAVEGUIDE LAYER
23: n-$In_{x3}(Ga_{1-z3}Al_{z3})_{1-x3}As_{1-y3}P_{y3}$ LOWER CLADDING LAYER
22: n-GaAs SUBSTRATE

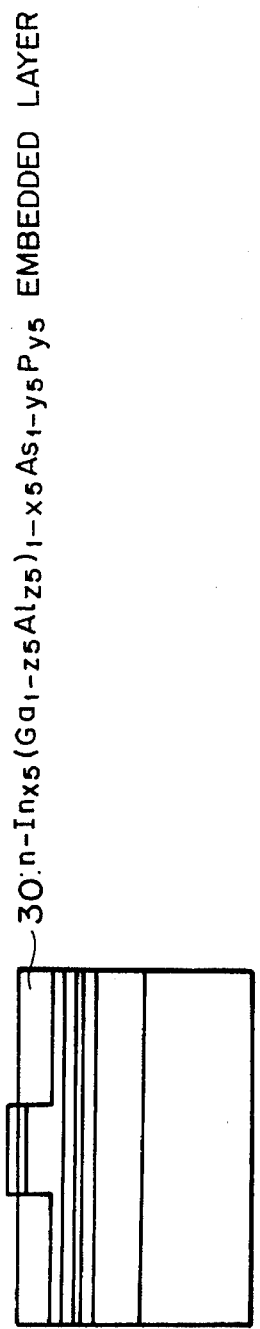

FIG. 3B

30: n-$In_{x5}(Ga_{1-z5}Al_{z5})_{1-x5}As_{1-y5}P_{y5}$ EMBEDDED LAYER

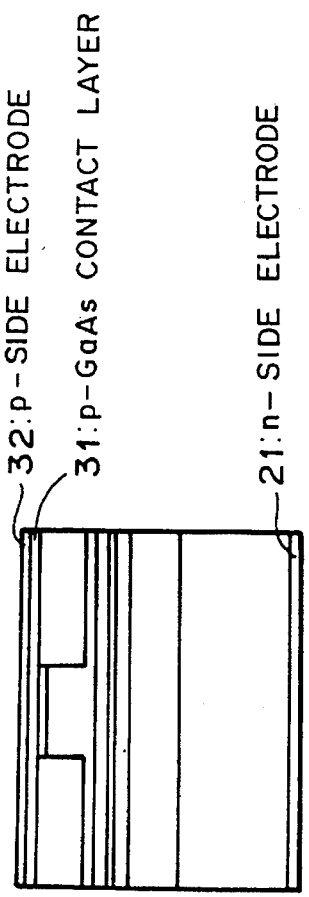

FIG. 3C

32: p-SIDE ELECTRODE
31: p-GaAs CONTACT LAYER
21: n-SIDE ELECTRODE

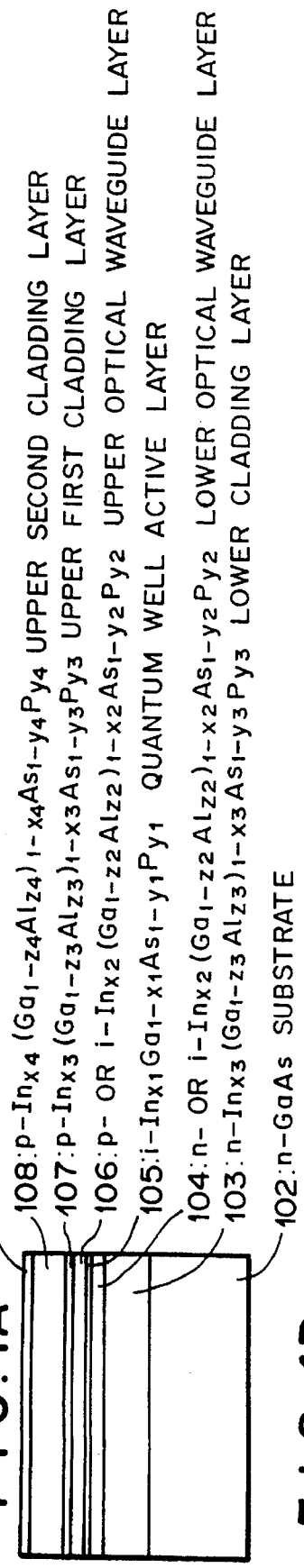

FIG.4A

- 109: p-GaAs CONTACT LAYER
- 108: p-In$_{x4}$(Ga$_{1-z4}$Al$_{z4}$)$_{1-x4}$As$_{1-y4}$P$_{y4}$ UPPER SECOND CLADDING LAYER
- 107: p-In$_{x3}$(Ga$_{1-z3}$Al$_{z3}$)$_{1-x3}$As$_{1-y3}$P$_{y3}$ UPPER FIRST CLADDING LAYER
- 106: p- OR i-In$_{x2}$(Ga$_{1-z2}$Al$_{z2}$)$_{1-x2}$As$_{1-y2}$P$_{y2}$ UPPER OPTICAL WAVEGUIDE LAYER
- 105: i-In$_{x1}$Ga$_{1-x1}$As$_{1-y1}$P$_{y1}$ QUANTUM WELL ACTIVE LAYER
- 104: n- OR i-In$_{x2}$(Ga$_{1-z2}$Al$_{z2}$)$_{1-x2}$As$_{1-y2}$P$_{y2}$ LOWER OPTICAL WAVEGUIDE LAYER
- 103: n-In$_{x3}$(Ga$_{1-z3}$Al$_{z3}$)$_{1-x3}$As$_{1-y3}$P$_{y3}$ LOWER CLADDING LAYER
- 102: n-GaAs SUBSTRATE

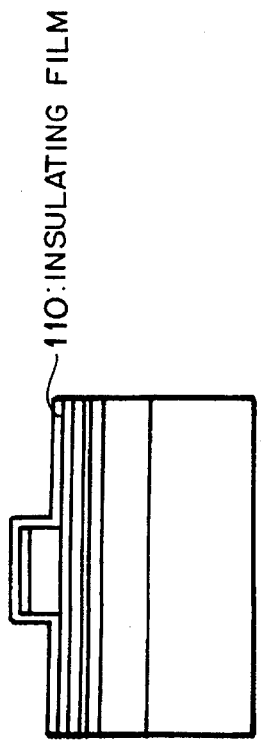

FIG.4B

- 110: INSULATING FILM

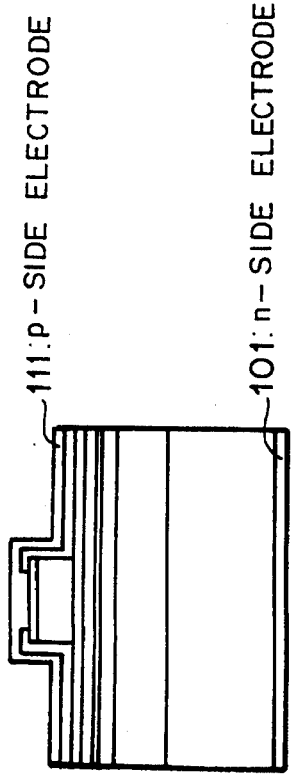

FIG.4C

- 111: p-SIDE ELECTRODE
- 101: n-SIDE ELECTRODE

SEMICONDUCTOR LASER

BACKGROUND OF THE INVENTION

1. Field of the Invention

This invention relates to a semiconductor laser. This invention particularly relates to a semiconductor laser, which comprises a Group III–V compound semiconductor and produces a laser beam having a wavelength in the band of 0.63 μm to 1.1 μm.

2. Description of the Prior Art

As a semiconductor laser, which produces a laser beam having a wavelength in the band of 0.7 μm to 0.85 μm, there has heretofore been known the semiconductor laser comprising an n-GaAs substrate, an n-AlGaAs cladding layer, an n- or i-AlGaAs optical waveguide layer, an i-AlGaAs active layer, a p- or i-AlGaAs optical waveguide layer, a p-AlGaAs cladding layer, and a p-GaAs capping layer, which layers are formed on the substrate. Such a semiconductor laser is described in, for example, a literature (1): "IEEE Journal of Quantum Electronics," QE-20, 1984, pp. 1119–1132, by W. T. Tsang.

Also, as a semiconductor laser, which produces a laser beam having a wavelength falling in the aforesaid band, there has heretofore been known the semiconductor laser comprising an n-GaAs substrate, an n-InGaP cladding layer, an n- or i-$In_{x2}Ga_{1-x2}As_{1-y2}P_{y2}$ optical waveguide layer, an i-$In_{x1}Ga_{1-x1}As_{1-y1}P_{y1}$ active layer (wherein x1<x2, y1<y2), a p- or i-$In_{x2}Ga_{1-x2}As_{1-y2}P_{y2}$ optical waveguide layer, a p-InGaP cladding layer, and a p-GaAs capping layer, which layers are formed on the substrate. Such a semiconductor laser is described in, for example, a literature (2): "Japanese Journal of Applied Physics," Vol. 31, 1992, pp. L1686–L1688, by J. S. Yoo, et al.

Further, as a semiconductor laser, which produces a laser beam having a wavelength in the band of 0.63 μm to 0.73 μm, there has heretofore been known the semiconductor laser comprising a GaAs substrate, an n-InGaAlP cladding layer, an i-InGaAlP optical waveguide layer, an InGaP tensile strained quantum well, an i-InGaAlP optical waveguide layer, a p-InGaAlP cladding layer, a p-InGaP barrier reducing layer, and a p-GaAs capping layer, which layers are formed on the substrate. Such a semiconductor laser is described in, for example, a literature (3): "IEEE Journal of Quantum Electronics," QE-30, 1994, p. 593, by D. P. Bour, et al.

Furthermore, as a semiconductor laser, which produces a laser beam having a wavelength of 1.03 μm, there has heretofore been known the semiconductor laser comprising a GaAs substrate, an n-InGaP cladding layer, an i-InGaAsP optical waveguide layer, an InGaAs compression strained quantum well, an i-InGaAsP optical waveguide layer, a p-InGaP cladding layer, and a p-GaAs capping layer, which layers are formed on the substrate. Such a semiconductor laser is described in, for example, a literature (4): "IEEE Photonics Technology Letters," Vol. 6, 1994, pp. 1–3, by G. Zhang, et al.

However, the structure described in the literature (1) has the drawbacks in that Al contained in the active layer is chemically active and apt to be oxidized, and therefore the end face of a resonator is readily deteriorated due to cleavage. Accordingly, the reliability of the semiconductor laser cannot be kept high.

The structure described in the literature (2) copes with the aforesaid drawbacks. However, this structure has the drawbacks in that the growth of the InGaP material markedly depends upon the orientation of the substrate surface and the growth conditions, and therefore a crystal having good quality cannot always be obtained with good reproducibility. These drawbacks are pointed out in, for example, a literature (5): "IEEE Journal of Quantum Electronics," QE-27, 1991, p. 1483, by H. Hamada, et al.

Further, as is pointed out in the literature (5), the structures described in the literatures (3) and (4) have the drawbacks such that, for example, the growth of the InGaAlP type of material markedly depends upon the orientation of the substrate surface and the growth conditions, and therefore a crystal having good quality cannot always be obtained with good reproducibility.

SUMMARY OF THE INVENTION

The primary object of the present invention is to provide a semiconductor laser, which produces a laser beam having a wavelength in the band of 0.63 μm to 1.1 μm and has a structure such that a crystal having good quality may be obtained with good reproducibility, and such that the reliability may be kept high even under conditions for radiating a laser beam having a high intensity.

Another object of the present invention is to provide a semiconductor laser, which produces a laser beam having a wavelength in the band of 0.63 μm to 1.1 μm and has a structure such that a crystal having good quality may be obtained with good reproducibility, such that the reliability may be kept high even under conditions for radiating a laser beam having a high intensity, and such that a fundamental transverse mode may be controlled appropriately.

The present invention provides a first semiconductor laser comprising an active layer, optical waveguide layers formed on opposite sides of the active layer, and cladding layers, wherein the active layer is constituted of an InGaAsP type of compound semiconductor, each of the optical waveguide layers is constituted of a compound semiconductor selected from the group consisting of an InGaAsP type of quaternary compound semiconductor, in which the content of As in the Group-V elements is at least 2%, and an InGaAlAsP type of five-element compound semiconductor, in which the content of As in the Group-V elements falls within the range of 2% to 10%, and each of the cladding layers is constituted of a compound semiconductor selected from the group consisting of an InGaAsP type of quaternary compound semiconductor, in which the content of As in the Group-V elements falls within the range of 2% to 10%, and an InGaAlAsP type of five-element compound semiconductor, in which the content of As in the Group-V elements falls within the range of 2% to 10%.

The present invention also provides a second semiconductor laser comprising an active layer, optical waveguide layers formed on opposite sides of the active layer, and cladding layers, wherein the active layer is constituted of an InGaAsP type of compound semiconductor, each of the optical waveguide layers is constituted of a compound semiconductor selected from the group consisting of an InGaAsP type of quaternary compound semiconductor, in which the content of As in the Group-V elements is at least 2%, and an InGaAlAsP type of five-element compound semiconductor, in which the content of As in the Group-V elements falls within the range of 2% to 10%, each of the cladding layers is constituted of a compound semiconductor selected from the group consisting of an InGaAsP type of quarternary compound semiconductor, in which the content of As in the Group-V elements is at least 2%, and an InGaAlAsP type of five-element compound semiconductor, in which the content of As in the Group-V elements is at least 2%, when one of the cladding layers, which is closer to a substrate of the semiconductor laser, is referred to as a lower cladding layer, and the other cladding layer, which is remoter from the substrate, is referred to as an upper cladding layer, the upper cladding layer comprises an upper first cladding layer, which is in contact with one of the optical waveguide layers, and an upper second cladding layer, which is formed on the side outward from the upper first cladding layer and in which the As/P ratio is higher than the As/P ratio in the upper first cladding layer, and in regions of the upper cladding layer other than a partial region thereof, etching is carried out from the outer surface side of the upper second cladding layer approximately up to a boundary between the upper first cladding layer and the upper second cladding layer, the partial region of the upper cladding layer remaining in a ridge-like form, whereby an optical waveguide is formed.

With the first and second semiconductor lasers in accordance with the present invention, the active layer does not contain Al, which is apt to be oxidized. Also, the optical waveguide layers and the cladding layers do not contain Al or contain only a comparatively small amount of Al. Therefore, the content of Al can be kept small. Accordingly, deterioration of the end face of the resonator can be restricted, and a high reliability can be obtained even under conditions for radiating a laser beam having a high intensity.

Also, with the first and second semiconductor lasers in accordance with the present invention, in the InGaAlAsP type of the Group III–V compound semiconductor, a layer structure is not provided which is obtained by growing a semiconductor, that contains only As as the Group-V element, on a semiconductor, that contains only P ds the Group-V element, or by growing a semiconductor, that contains only P as the Group-V element, on a semiconductor, that contains only As as the Group-V element. Therefore, the problems can be prevented from occurring in that the crystalline properties deteriorate due to replacement of As and P occurring at the hetero-interface in such a layer structure. Accordingly, also by virtue of this feature, the reliability of the first and second semiconductor lasers in accordance with the present invention can be kept high even under the conditions for radiating a laser beam having a high intensity.

Further, with the first and second semiconductor lasers in accordance with the present invention, the cladding layers are constituted of the InGaAsP type of the material or the InGaAlAsP type of the material. Therefore, the problems do not occur in that, as in cases where the cladding layers are constituted of an InGaP type of material, the crystal growth markedly depends upon the orientation of the substrate surface and the growth conditions. Accordingly, a crystal having good quality can be obtained with good reproducibility.

With the second semiconductor laser in accordance with the present invention, the As/P ratio in the upper second cladding layer, which is formed on the side outward from the upper first cladding layer, is higher than the As/P ratio in the upper first cladding layer. Therefore, when the partial region of the upper cladding layer is kept remaining in a ridge-like form, and the optical waveguide is thereby formed by the etching step, substantially only the upper second cladding layer, which has a higher As/P ratio and can be easily undergo selective chemical etching, can be etched, and the etching can be terminated at the boundary between the upper first cladding layer and the upper second cladding layer. With the second semiconductor laser in accordance with the present invention, the depth of etching can thus be controlled accurately, and therefore the fundamental transverse mode can be controlled appropriately even in a high-intensity beam radiating region.

BRIEF DESCRIPTION OF THE DRAWINGS

FIGS. 1A, 1B, and 1C are schematic views showing a layer structure in a first embodiment of the semiconductor laser in accordance with the present invention, FIGS. 3A, 3B, and 3C are schematic views showing a layer structure in a second embodiment of the semiconductor laser in accordance with the present invention, FIGS. 4A 4B and 4C are schematic views showing a layer structure in a third embodiment of the semiconductor laser in accordance with the present invention.

DESCRIPTION OF THE PREFERRED EMBODIMENTS

Figure 2:
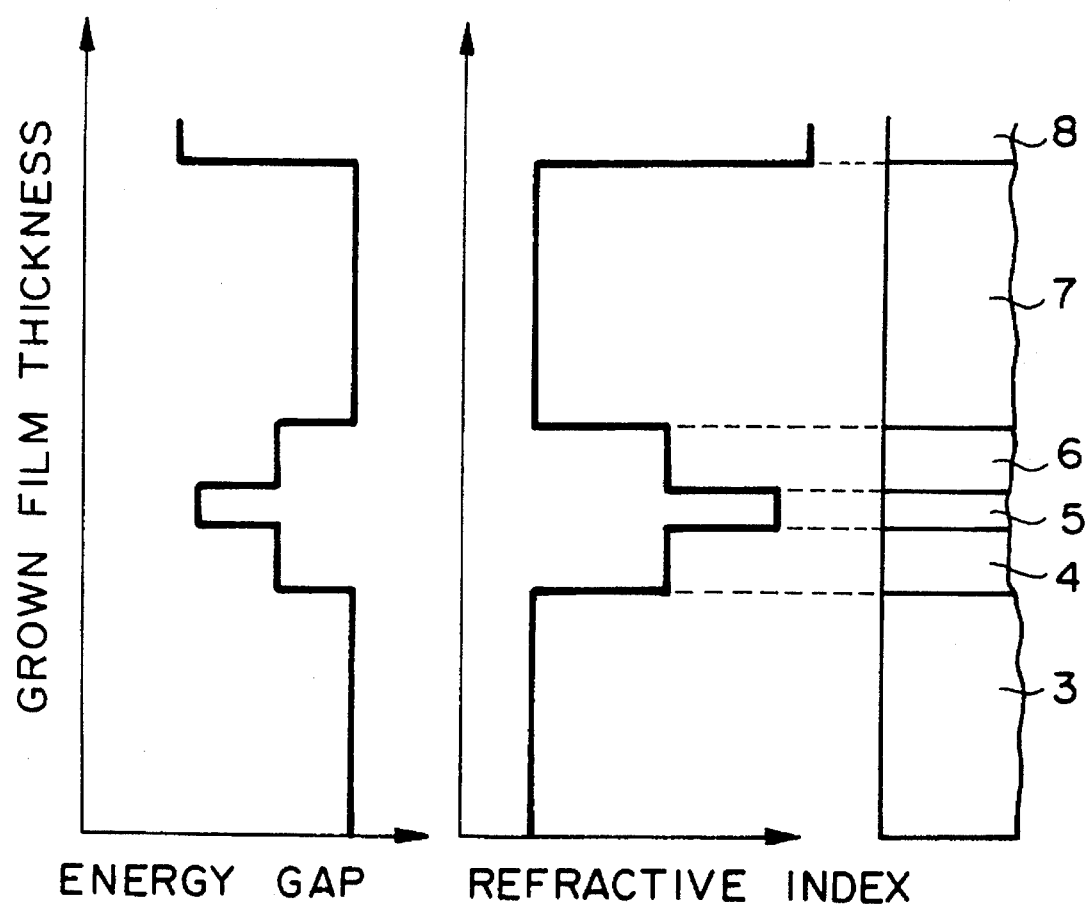
FIG. 2 is a graph showing refractive indexes and energy gaps of respective layers in the first embodiment.

The present invention will hereinbelow be described in further detail with reference to the accompanying drawings.

FIGS. 1A, 1B, and 1C show how a first embodiment of the semiconductor laser in accordance with the present invention is produced.

As illustrated in FIG. 1A, on an n-GaAs (001) substrate 2, an n-$In_{x3}(Ga_{1-z3}Al_{z3})_{1-x3}As_{1-x3}P_{y3}$ lower cladding layer 3 (wherein $0 \leq z3 \leq 1$, $0.9 \leq y3 \leq 0.98$, $x3 \approx 0.49y3$), an n- or i-$In_{x2}(Ga_{1-z2}Al_{z2})_{1-x2}As_{1-y2}P_{y2}$ lower optical waveguide layer 4 (wherein $0 \leq z2 \leq z3$, $0 \leq y2 \leq 0.98$, $x2 \approx 0.49y2$), an i-$In_{x1}Ga_{1-x1}As_{1-y1}P_{y1}$ quantum well active layer 5 (wherein $x1 \approx 0.49y1$, $0 \leq y1 \leq 0.98$), a p- or i-$In_{x2}(Ga_{1-z2}Al_{z2})_{1-x2}As_{1-y2}P_{y2}$ upper optical waveguide layer 6, a p-$In_{x3}(Ga_{1-z3}Al_{z3})_{1-x3}As_{1-y3}P_{y3}$ upper cladding layer 7, and a p-GaAs contact layer 8, which layers are lattice matched with GaAs, are successively grown with a metalorganic chemical vapor deposition process (MO-CVD).

At this time, as illustrated in FIG. 2, the compositions of the layers 3 through 7 are adjusted such that the refractive index may become larger in the order of the cladding layers 3 and 7, the optical waveguide layers 4 and 6, and the active layer 5, and such that the energy gap may become smaller in this order.

Thereafter, as illustrated in FIG. 1B, in order to form an optical waveguide, a ridge stripe having a width of approximately 3 μm and having grooves on both sides of it is formed with the ordinary lithographic and etching techniques. At this time, the depth of etching is adjusted such that the refractive index wave guiding in the ridge structure can be achieved until a laser beam having a high intensity is radiated. Thereafter, an insulating film 9 is formed.

Thereafter, as illustrated in FIG. 1C, the insulating film 9 in the region at the top of the ridge is removed with the ordinary lithographic technique, and then a p-side electrode 10 is formed. Also, on the back side of the substrate 2, an n-side electrode 1 is formed. In this manner, a semiconductor laser, which produces a laser beam having a wavelength in the range of 660 nm to 870 nm, is obtained. The wavelength of the produced laser beam can be controlled arbitrarily within the aforesaid range by appropriately determining x1 and y1 under the relationship of $x1 \approx 0.49y1$ and $0 \leq y1 \leq 0.98$.

A second embodiment of the semiconductor laser in accordance with the present invention will be described hereinbelow with reference to FIGS. 3A, 3B, and 3C.

As illustrated in FIG. 3A, on an n-GaAs (001) substrate 22, an n-$In_{x3}(Ga_{1-z3}Al_{z3})_{1-x3}As_{1-y3}P_{y3}$ lower cladding layer 23, an n- or i-$In_{x2}(Ga_{1-z2}Al_{z2})_{1-x2}As_{1-y2}P_{y2}$ lower optical waveguide layer 24, an i-$In_{x1}Ga_{1-x1}As_{1-y1}P_{y1}$ quantum well active layer 25, a p- or i-$In_{x2}(Ga_{1-z2}Al_{z2})_{1-x2}As_{1-y2}P_{y2}$ upper optical waveguide layer 26, a p-$In_{x3}(Ga_{1-z3}Al_{z3})_{1-x3}As_{1-y3}P_{y3}$ upper cladding layer 27, and a p-GaAs capping layer 28, which layers are lattice matched with GaAs, are successively grown with the metalorganic chemical vapor deposition process (MO-CVD). Thereafter, an insulating film 29 is formed.

The compositions of the layers 23, 24, 25, 26, 27, and 28 are respectively identical with the compositions of the layers 3, 4, 5, 6, 7, and 8 in the first embodiment.

Thereafter, as illustrated in FIG. 3B, in order to form an optical waveguide, a ridge stripe, which has a width of approximately 3 μm, which has grooves on both sides of it, and which is provided with the insulating film 29 serving as a mask, is formed with the ordinary lithographic and etching techniques. At this time, the depth of the ridge is adjusted such that the refractive index wave guiding in the ridge structure can be achieved until a laser beam having a high intensity is radiated. Thereafter, with the insulating film 29 serving as the mask, an n-$In_{x5}(Ga_{1-z5}Al_{z5})_{1-x5}As_{1-y5}P_{y5}$ layer 30 (wherein $z3 \leq z5 \leq 1$, $0.9 \leq y5 \leq 0.98$, $x5 \approx 0.49y5$), which is lattice matched with GaAs, is embedded selectively. The composition of the embedded layer 30 is adjusted such that its refractive index may be smaller than the refractive index of the aforesaid p-$In_{x3}(Ga_{1-z3}Al_{z3})_{1-x3}As_{1-y3}P_{y3}$ upper cladding layer 27.

Thereafter, as illustrated in FIG. 3C, the insulating film 29 is removed, a p-GaAs contact layer 31 is grown, and then a p-side electrode 32 is formed on the p-GaAs contact layer 31. Also, on the back side of the substrate 22, an n-side electrode 21 is formed. In this manner, a semiconductor laser, which produces a laser beam having a wavelength in the range of 660 nm to 870 nm, is obtained. The wavelength of the produced laser beam can be controlled arbitrarily within the aforesaid range in the same manner as that in the first embodiment.

The two embodiments described above has the structures referred to as SQW-SCH, wherein a single quantum well is provided and the compositions of the optical waveguide layers are identical with each other. The present invention is also applicable to an MQW structure, wherein a plurality of quantum wells are provided. Further, as for the optical waveguide layers, a GRIN structure (GRaded-INdex), i.e. a distributed index structure, may be employed.

Also, in the two embodiments described above, the n-type of substrate is employed. In the present invention, a p-type of substrate can also be employed. Further, as for the active layer, a quantum well structure or a strained quantum well structure may be employed. In cases where the active layer is a strained quantum well, a optical waveguide layer having a strain, which cancels the strain of the strained quantum well, may be employed.

Further, the two embodiments described above have the simple ridge structures. It is also possible to carry out a process with the ordinary lithographic and etching techniques on each of the structures of the aforesaid embodiments, and thereby to form a semiconductor laser provided with a refractive index wave guiding mechanism. It is further possible to form a semiconductor laser provided with a diffraction grating or to form an integrated optical circuit. Moreover, for example, a p-n-p structure, which is formed by three-layer embedded growth, may be applied as a current constricting mechanism.

Furthermore, in the aforesaid embodiments, each of the active layer and the optical waveguide layers is lattice matched with GaAs, and therefore the relationship of $x1 \approx 0.49y1$ and $x2 \approx 0.49y2$ obtains. In cases where each of these layers strained, such relationship does not obtain.

In cases where the active layer is constituted of $In_{x1}Ga_{1-y1}As_{1-y1}P_{y1}$, a laser beam having a wavelength in the band described above can be obtained. In cases where the active layer is constituted of an $In_{x1}Ga_{1-x1}As_{1-y1}P_{y1}$ strained quantum well structure, which is not lattice matched with the GaAs substrate, the wavelength of the produced laser beam can be controlled within the range of 630 nm to 1,100 nm.

As the crystal growth method, it is also possible to employ the molecular-beam epitaxial growth method utilizing a solid or a gas as the raw material.

FIGS. 4A, 4B, and 4C show how a third embodiment of the semiconductor laser in accordance with the present invention is produced.

As illustrated in FIG. 4A, on an n-GaAs (001) substrate 102, an n-$In_{x3}(Ga_{1-z3}Al_{z3})_{1-x3}As_{1-y3}Py_{y3}$ lower cladding layer 103 (wherein $0 \leq z3 \leq 1$, $0.9 \leq y3 \leq 0.98$, $x3 \approx 0.49y3$), an n- or i-$In_{x2}(Ga_{1-z2}Al_{z2})_{1-x2}As_{1-y2}P_{y2}$ lower optical waveguide layer 104 (wherein $0 \leq z2 \leq z3$, $0 \leq y2 \leq 0.98$, $x2 \approx 0.49y2$), an i-$In_{x1}Ga_{1-x1}As_{1-y1}P_{y1}$ quantum well active layer 105 (wherein $0 \leq y1 \leq 0.98$, $x1 \approx 0.49y1$) , a p- or i-$In_{x2}(Ga_{1-z2}Al_{z2})_{1-x2}As_{1-y2}P_{y2}$ upper optical waveguide layer 106, a p-$In_{x3}(Ga_{1-z3}Al_{z3})_{1-x3}As_{1-y3}P_{y3}$ upper first cladding layer 107, a p-$In_{x4}(Ga_{1-z4}Al_{z3})_{1-x4}As_{1-y4}P_{y4}$ upper second cladding layer 108 (wherein $0 \leq z3 < z4$, $0 \leq y4 \leq 0.5$, $x4 \approx 0.49y4$), and a p-GaAs contact layer 109, which layers are lattice matched with GaAs, are successively grown with the metalorganic chemical vapor deposition process (MO-CVD).

Figure 5:
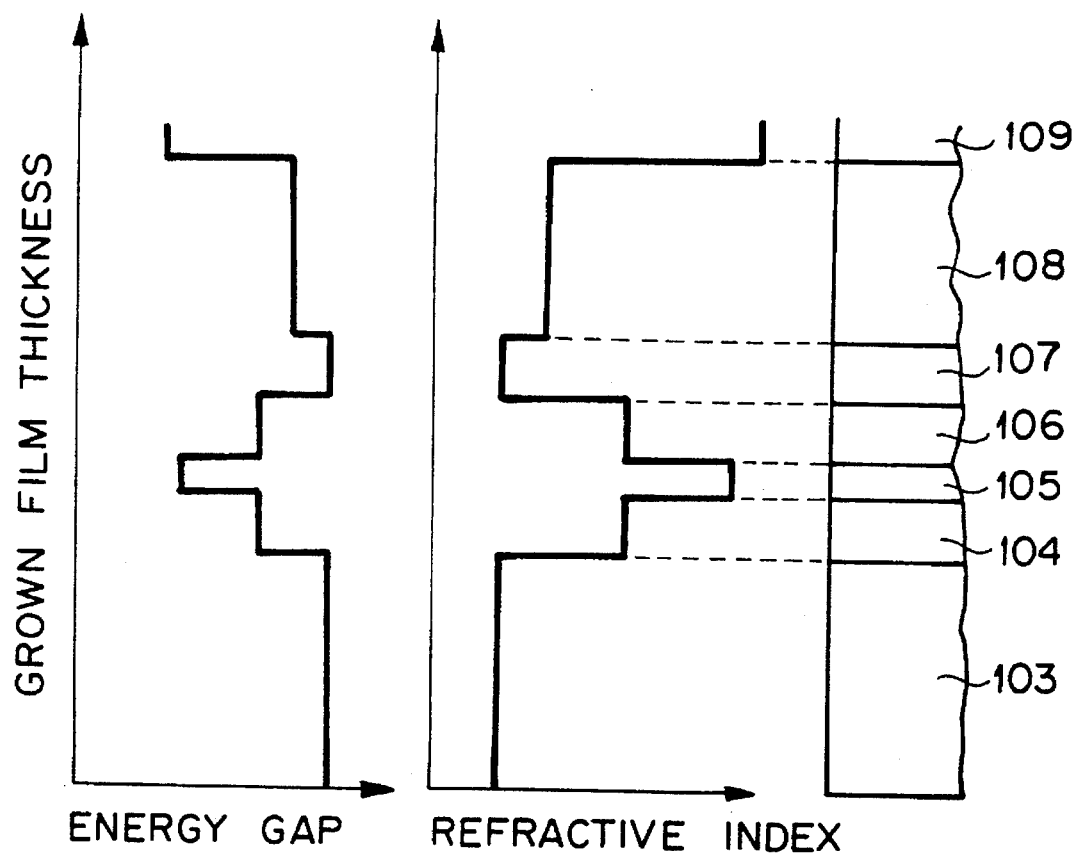
FIG. 5 is a graph showing refractive indexes and energy gaps of respective layers in the third embodiment.

At this time, as illustrated in FIG. 5, the compositions of the layers 103 through 108 are adjusted such that the refractive index may become larger in the order of the cladding layers 103, 107, and 108, the optical waveguide layers 104 and 106, and the active layer 105, and such that the energy gap may become smaller in this order.

Thereafter, as illustrated in FIG. 4B, in order to form an optical waveguide, a ridge stripe having a width of approximately 3 μm and having grooves on both sides of it is formed with the ordinary lithographic and sulfuric acid-based wet etching techniques. At this time, the upper second cladding layer 108, which has the As/P ratio higher than the As/P ratio in the upper first cladding layer 107, is apt to be etched with the sulfuric acid-based etching liquid. The upper first cladding layer 107 is not easily etched with the sulfuric acid-based etching liquid. Therefore, the etching for forming the ridge can be easily terminated at the position in the vicinity of the boundary between the upper first cladding layer 107 and the upper second cladding layer 108. The thickness of the upper second cladding layer 108 is adjusted such that the refractive index wave guiding in the ridge structure can be achieved until a laser beam having a high intensity is radiated. Thereafter, an insulating film 110 is formed.

Thereafter, as illustrated in FIG. 4C, the insulating film 110 in the region at the top of the ridge is removed with the ordinary lithographic technique, and then a p-side electrode 111 is formed. Also, on the back side of the substrate 102, an n-side electrode 101 is formed. In this manner, a semiconductor laser, which produces a laser beam having a wavelength in the range of 660 nm to 870 nm, is obtained. The wavelength of the produced laser beam can be controlled arbitrarily within the aforesaid range by appropriately determining x1 and y1 under the relationship of $x1 \approx 0.49 y1$ and $0 \leq y1 \leq 0.98$.

Figure 6A:
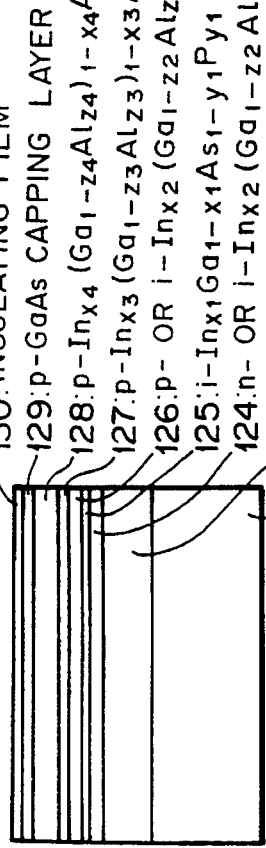
FIGS. 6A, 6B, and 6C are schematic views showing a layer structure in a fourth embodiment of the semiconductor laser in accordance with the present invention.

A fourth embodiment of the semiconductor laser in accordance with the present invention will be described hereinbelow with reference to FIGS. 6A, 6B, and As illustrated in FIG. 6A, on an n-GaAs (001) substrate 122, an n-$In_{x3}(Ga_{1-z3}Al_{z3})_{1-x3}As_{1-y3}P_{y3}$ lower cladding layer 123, an n- or i-$In_{x2}(Ga_{1-z2}Al_{z2})_{1-x2}As_{1-y2}P_{y2}$ lower optical waveguide layer 124, an i-$In_{x1}Ga_{1-x1}As_{1-y1}P_{y1}$ quantum well active layer 125, a p- or i-$In_{x2}(Ga_{1-z2}Al_{z2})_{1-x2}As_{1-y2}P_{y2}$ upper optical waveguide layer 126, a p-$In_{x3(Ga1-z3}Al_{z3})_{1-x3}As_{1-y3}P_{y3}$ upper first cladding layer 127, a p-$In_{x4}(Ga_{1-z4}Al_{z4})_{1-x4}As_{1-y4}P_{y4}$ upper second cladding layer 128, and a p-GaAs capping layer 129, which layers are lattice matched with GaAs, are successively grown with the metalorganic chemical vapor deposition process (MO-CVD). Thereafter, an insulating film 130 is formed.

The compositions of the layers 123, 124, 125, 126, 127, and 128 are respectively identical with the compositions of the layers 103, 104, 105, 106, 107, and 108 in the third embodiment.

Figure 6B:
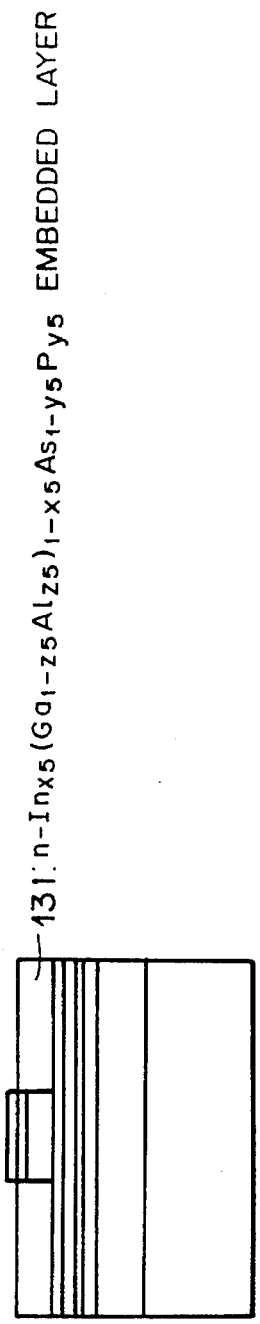

Thereafter, as illustrated in FIG. 6B, in order to form an optical waveguide, a ridge stripe, which has a width of approximately 3 µm, which has grooves on both sides of it, and which is provided with the insulating film 130 serving as a mask, is formed with the ordinary lithographic and sulfuric acid-based wet etching techniques. At this time, the upper second cladding layer 128, which has the As/P ratio higher than the As/P ratio in the upper first cladding layer 127, is apt to be etched with the sulfuric acid-based etching liquid. The upper first cladding layer 127 is not easily etched with the sulfuric acid-based etching liquid. Therefore, the etching for forming the ridge can be easily terminated at the position in the vicinity of the boundary between the upper first cladding layer 127 and the upper second cladding layer 128. The thickness of the upper second cladding layer 128 is adjusted such that the refractive index wave guiding in the ridge structure can be achieved until a laser beam having a high intensity is radiated.

Thereafter, with the insulating film 130 serving as the mask, an n-$In_{x5}(Ga_{1-z5}Al_{z5})_{1-x5}As_{1-y5}P_{y5}$ layer 131 (wherein $0 \leq z5 \leq 1$, $0.9 \leq y5 \leq 0.98$, $x5 \approx 0.49 y5$), which is lattice matched with GaAs, is embedded selectively. The composition of the embedded layer 131 is adjusted such that its refractive index may be smaller than the refractive index of the aforesaid p-$In_{x4}(Ga_{1-z4}Al_{z4})_{1-x4}As_{1-y4}P_{y4}$ upper second cladding layer 128.

Figure 6C:
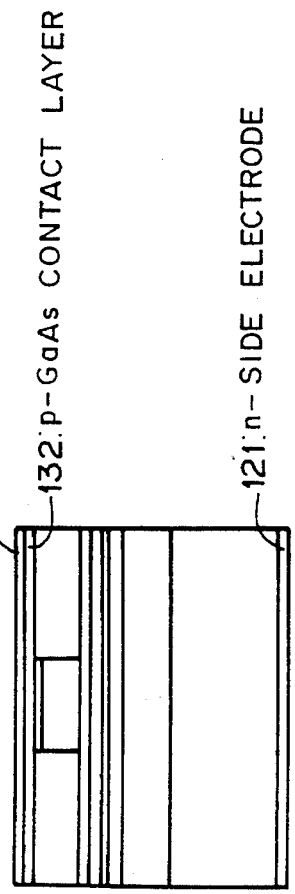

Thereafter, as illustrated in FIG. 6C, the insulating film 130 is removed, a p-GaAs contact layer 132 is grown, and then a p-side electrode 133 is formed on the p-GaAs contact layer 132. Also, on the back side of the substrate 122, an n-side electrode 121 is formed. In this manner, a semiconductor laser, which produces a laser beam having a wavelength in the range of 660 nm to 870 nm, is obtained. The wavelength of the produced laser beam can be controlled arbitrarily within the aforesaid range in the same manner as that in the third embodiment.

The third and fourth embodiments described above has the structures referred to as SQW-SCH, wherein a single quantum well is provided and the compositions of the optical waveguide layers are identical with each other. The present invention is also applicable to an MQW structure, wherein a plurality of quantum wells are provided. Further, as for the optical waveguide layers, a GRIN structure (GRaded-INdex), i.e. a distributed index structure, may be employed.

Also, in the third and fourth embodiments described above, the n-type of substrate is employed. In the present invention, a p-type of substrate can also be employed. Further, as for the active layer, a strained quantum well structure may be employed. In cases where the active layer is a strained quantum well, an optical waveguide layer having a strain, which cancels the strain of the strained quantum well, may be employed. Moreover, in order to achieve the symmetry of the cross section of the radiated beam, the lower cladding layer may be composed of two layers as in the upper cladding layer.

Further, the third and fourth embodiments described above have the simple ridge structures. It is also possible to carry out a process with the ordinary lithographic and etching techniques on each of the structures of the third and fourth embodiments, and thereby to form a semiconductor laser provided with a refractive index wave guiding mechanism. It is further possible to form a semiconductor laser provided with a diffraction grating or to form an integrated optical circuit. Moreover, for example, a p-n-p structure, which is formed by three-layer embedded growth, may be applied as a current constricting mechanism.

Furthermore, in the third and fourth embodiments, each of the active layer and the optical waveguide layers is lattice matched with GaAs, and therefore the relationship of $x1 \approx 0.49 y1$ and $x2 \approx 0.49 y2$ obtains. In cases where each of these layers is strained, such relationship does not obtain.

Also, in the third and fourth embodiments, in cases where the active layer is constituted of $In_{x1}Ga_{1-z1}As_{1-y1}P_{yz}$, a laser beam having a wavelength in the band described above can be obtained. In cases where the active layer is constituted of an $In_{x1}Ga_{1-x1}As_{1-y1}P_{y1}$ strained quantum well structure, which is not lattice matched with the GaAs substrate, the wavelength of the produced laser beam can be controlled within the range of 630 nm to 1,100 nm.

Further, in the third and fourth embodiments, as the crystal growth method, it is also possible to employ the molecular-beam epitaxial growth method utilizing a solid or a gas as the raw material.

What is claimed is:

1. A semiconductor laser comprising an active layer, optical waveguide layers formed on opposite sides of the active layer, and cladding layers, wherein the active layer is constituted of an InGaAsP type of compound semiconductor, each of the optical waveguide layers is constituted of a compound semiconductor selected from the group consisting of an InGaAsP type of quaternary compound semiconductor, in which the content of As in the Group-V segments is at least 2%, and an InGaAlAsP type of five-element compound semiconductor, in which the content of As in the Group-V elements falls within the range of 2% to 10%, and each of the cladding layers is constituted of a compound semiconductor selected from the group consisting of an InGaAsP type of quarternary compound semiconductor, in which the content of As in the Group-V elements falls within the range of 2% to 10%, and an InGaAlAsP type of five-element compound semiconductor, in which the content of As in the Group-V elements falls within the range of 2% to 10%.

2. A semiconductor laser as defined in claim 1 wherein said active layer is constituted of $In_{x1}Ga_{1-x1}As_{1-y1}P_{y1}$ (where $0 \leq y1 \leq 0.98$), each of said optical waveguide layers is constituted of $In_{x2}(Ga_{1-z2}Al_{z2})_{1-x2}As_{1-y2}P_{y2}$ (where $0 \leq z2 \leq 1$, $0 \leq y2 \leq 0.98$), and each of said cladding layers is constituted of $In_{x3}(Ga_{1-z3}Al_{z3})_{1-x3}As_{1-y3}P_{y3}$ (where $0 \leq z2 \leq z3 \leq 1$, $0.9 \leq y3 \leq 0.98$, $x3 \approx 0.49y3$), which is lattice matched with GaAs.

3. A semiconductor laser comprising an active layer, optical waveguide layers formed on opposite sides of the active layer, and cladding layers, wherein the active layer is constituted of an InGaAsP type of compound semiconductor, each of the optical waveguide layers is constituted of a compound semiconductor selected from the group consisting of an InGaAsP type of quarternary compound semiconductor, in which the content of As in the Group-V elements is at least 2%, and an InGaAlAsP type of five-element compound semiconductor, in which the content of As in the Group-V elements falls within the range of 2% to 10%, each of the cladding layers is constituted of a compound semiconductor selected from the group consisting of an InGaAsP type of quarternary compound semiconductor, in which the content of As in the Group-V elements is at least 2%, and an InGaAlAsP type of five-element compound semiconductor, in which the content of As in the Group-V elements is at least 2%, when one of the cladding layers, which is closer to a substrate of the semiconductor laser, is referred to as a lower cladding layer, and the other cladding layer, which is remoter from the substrate, is referred to as an upper cladding layer, said upper cladding layer comprises an upper first cladding layer, which is in contact with one of the optical waveguide layers, and an upper second cladding layer, which is formed on the side outward from said upper first cladding layer and in which the As/P ratio is higher than the As/P ratio in said upper first cladding layer, and in regions of said upper cladding layer other than a partial region thereof, etching is carried out from the outer surface side of said upper second cladding layer approximately up to a boundary between said upper first cladding layer and said upper second cladding layer, said partial region of said upper cladding layer remaining in a ridge-like form, whereby an optical waveguide is formed.

4. A semiconductor laser as defined in claim 3 wherein said active layer is constituted of $In_{x1}Ga_{1-x1}As_{1-y1}P_{y1}$ (where $0 \leq y1 \leq 0.98$), each of said optical waveguide layers is constituted of $In_{x2}(Ga_{1-z2}Al_{z2})_{1-x2}As_{1-y2}P_{y2}$ (where $0 \leq z2 \leq 1$, $0 \leq y2 \leq 0.98$), each of said lower cladding layer and said upper first cladding layer is constituted of $In_{x3}(Ga_{1-z3}Al_{z3})_{1-x3}As_{1-y3}P_{y3}$ (where $0 \leq z2 \leq z3 \leq 1$, $0.9 \leq y3 \leq 0.98$, $x3 \approx 0.49y3$), which is lattice matched with GaAs, and said upper second cladding layer is constituted of $In_{x4}(Ga_{1-z4}Al_{z4})_{1-x4}As_{1-y4}P_{y4}$ (where $0 \leq z3 < z4$, $0 \leq y4 \leq 0.5$, $x4 \approx 0.49y4$), which is lattice matched with GaAs.

* * * * *